(12) United States Patent
Nagadomi et al.

(10) Patent No.: US 8,078,923 B2
(45) Date of Patent: Dec. 13, 2011

(54) SEMICONDUCTOR MEMORY DEVICE WITH ERROR CORRECTION

(75) Inventors: Yasushi Nagadomi, Yokohama (JP); Daisaburo Takashima, Yokohama (JP); Kosuke Hatsuda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 213 days.

(21) Appl. No.: 12/523,607

(22) PCT Filed: Sep. 30, 2008

(86) PCT No.: PCT/JP2008/068125
§ 371 (c)(1),
(2), (4) Date: Jul. 17, 2009

(87) PCT Pub. No.: WO2009/044904
PCT Pub. Date: Apr. 9, 2009

(65) Prior Publication Data
US 2010/0107021 A1     Apr. 29, 2010

(30) Foreign Application Priority Data
Oct. 3, 2007     (JP) .................................. 2007-259818

(51) Int. Cl.
*G06F 11/00*     (2006.01)
(52) U.S. Cl. ........................................................ 714/706
(58) Field of Classification Search .................. 714/704, 714/764, 773, 706
See application file for complete search history.

(56) References Cited

U.S. PATENT DOCUMENTS

| | | | |
|---|---|---|---|
| 4,694,454 A * | 9/1987 | Matsuura ........................ 714/6.1 |
| 5,224,105 A * | 6/1993 | Higley ........................... 714/748 |
| 5,504,760 A * | 4/1996 | Harari et al. ................... 714/763 |
| 5,671,228 A | 9/1997 | Nagashima | |
| 6,898,117 B2 * | 5/2005 | So et al. .................... 365/185.03 |
| 7,099,190 B2 | 8/2006 | Noguchi et al. | |
| 7,447,936 B2 * | 11/2008 | Shiota et al. ................... 714/6.1 |
| 7,453,728 B2 | 11/2008 | Noguchi et al. | |

(Continued)

FOREIGN PATENT DOCUMENTS

EP     0 713 303     5/1996

(Continued)

OTHER PUBLICATIONS

Office Action issued Jan. 14, 2011 in Korea Application No. 10-2009-7017089 (With English Translation).

*Primary Examiner* — James C Kerveros
(74) *Attorney, Agent, or Firm* — Oblon, Spivak, McClelland, Maier & Neustadt, L.L.P.

(57) ABSTRACT

This disclosure concerns a memory including: a first memory region including memory groups including a plurality of memory cells, addresses being respectively allocated for the memory groups, the memory groups respectively being units of data erase operations; a second memory region temporarily storing therein data read from the first memory region or temporarily storing therein data to be written to the first memory region; a read counter storing therein a data read count for each memory group; an error-correcting circuit calculating an error bit count of the read data; and a controller performing a refresh operation, in which the read data stored in one of the memory groups is temporarily stored in the second memory region and is written back the read data to the same memory group, when the error bit count exceeds a first threshold or when the data read count exceeds a second threshold.

11 Claims, 15 Drawing Sheets

FIRST EMBODIMENT

U.S. PATENT DOCUMENTS

| | | |
|---|---|---|
| 7,631,228 B2 * | 12/2009 | Brittain et al. .............. 714/704 |
| 7,793,172 B2 * | 9/2010 | Bruce et al. ................. 714/708 |
| 2003/0033567 A1 | 2/2003 | Tamura et al. |
| 2005/0248999 A1 | 11/2005 | Tamura et al. |
| 2006/0158948 A1 | 7/2006 | Fuji |
| 2007/0091678 A1 | 4/2007 | Kato et al. |
| 2008/0229164 A1 | 9/2008 | Tamura et al. |
| 2009/0010048 A1 | 1/2009 | Fuji |
| 2009/0055680 A1 * | 2/2009 | Honda et al. ................. 714/5 |

FOREIGN PATENT DOCUMENTS

JP 2004 326867 11/2004

* cited by examiner

FIG. 1  FIRST EMBODIMENT

REFRESH OPERATION

SECOND EMBODIMENT

THIRD EMBODIMENT

MODIFICATION OF THIRD EMBODIMENT

FOURTH EMBODIMENT

|  | MAXIMUM VALUE REGISTER | FLAG REGISTER |
|---|---|---|
| Block 0 | 5 | 0 |
| Block 1 | 30 | 0 |
| Block 2 | 12 | 1 |
| ... | ... | ... |

FIG. 14

MODIFICATION OF FOURTH EMBODIMENT

SEMICONDUCTOR MEMORY DEVICE WITH ERROR CORRECTION

BACKGROUND OF THE INVENTION

1. Field of the Invention

The present invention relates to a semiconductor memory device, for example, a NAND flash memory device.

2. Related Art

Semiconductor memory devices are widely used in computers, home electric appliances, portable telephones and the like. An EEPROM (Electrically Erasable and Programmable Read Only Memory) type nonvolatile memory device typified by a NAND flash memory has been generally used as a storage medium of a personal computer, a digital camera, a digital video recorder, a digital television, an MP3 or a portable device.

Furthermore, because of its excellence as large capacity and high integration, the NAND flash memory has been lately used to replace a hard disk drive (HDD). If the NAND flash memory is used to replace the hard disk drive, such problems as data deterioration resulting from read disturbance and physical deterioration in a gate dielectric film resulting from repetition of erasure and write occur.

The physical deterioration in the gate dielectric film triggers retention failure. Namely, electric charges (e.g., electrons) are emitted from a floating gate in short time and data is destroyed. The number of writes (hereinafter, "write count") to the NAND flash memory is up to about $10^5$. To deal with the limited write count, a refresh operation and wear leveling are performed. The refresh operation is an operation for reading data from a memory cell once and for restoring data identical with the read data to the memory cell. The wear leveling is an operation for leveling the number of erasures (hereinafter, "erase count") by exchanging a physical address of a block having a high erase count with that of a block having a low erase count.

Moreover, in the NAND memory, data is read from selected memory cells by applying high voltage to gates of unselected memory cells (including unselected memory cells at pages other than read target pages). Since the high voltage is repeatedly applied to the unselected memory cells whenever a data read operation is performed, charges enter floating gates. As a result, data stored in the memory cells is destroyed. This phenomenon is called "read disturbance".

Conventionally, error correction has been made using ECC (Error-Correcting Code) to prevent the read disturbance. However, to correct many error bits, a large-capacity ECC circuit is necessary. Further, because of miniaturization of the memory device and multiplication of levels for storing information of two bits or more in one cell, a larger-capacity ECC circuit is necessary.

SUMMARY OF THE INVENTION

A semiconductor memory device according to an embodiment of the invention comprises a first memory region including a plurality of memory groups including a plurality of memory cells, addresses being respectively allocated for the memory groups, the memory groups respectively being units of data erase operations; a second memory region temporarily storing therein data read from the first memory region or temporarily storing therein data to be written to the first memory region; a read counter storing therein a data read count for each memory group; an error-correcting circuit calculating an error bit count of the read data; and a controller performing a refresh operation, in which the read data stored in one of the memory groups is temporarily stored in the second memory region and is written back the read data to the same memory group, when the error bit count exceeds a first threshold or when the data read count exceeds a second threshold.

A semiconductor memory device according to embodiment of the invention comprises a first memory region including a plurality of memory groups including a plurality of memory cells, addresses being respectively allocated for the memory groups, the memory groups respectively being units of data erase operations; a second memory region temporarily storing therein data read from the first memory region or temporarily storing therein data to be written to the first memory region; an error-correcting circuit calculating an error bit count of the read data; a controller performing a refresh operation, in which the read data stored in one of the memory groups is temporarily stored in the second memory region and is written back the read data to the same memory group; a maximum value register holding a maximum error bit count among error bit counts during a period from a certain refresh operation to a next refresh operation; and a flag register storing therein flags for the memory blocks, one of the flags indicating a first read operation to the corresponding memory block after restart of a supply of power to the first memory region, when the supply of the power restarts after stop thereof, wherein when the error bit count in the first read operation since the supply of the power to the first memory region restarts is higher than the maximum error bit count before the restart of the supply of the power, the controller executes the refresh operation.

BRIEF DESCRIPTION OF THE DRAWINGS

FIG. 14 is a conceptual diagram showing a maximum value register 27 and a flag register 28.

DETAILED DESCRIPTION OF THE INVENTION

Embodiments of the present invention will be explained below in detail with reference to the accompanying drawings. Note that the invention is not limited thereto.

First Embodiment

Figure 1:
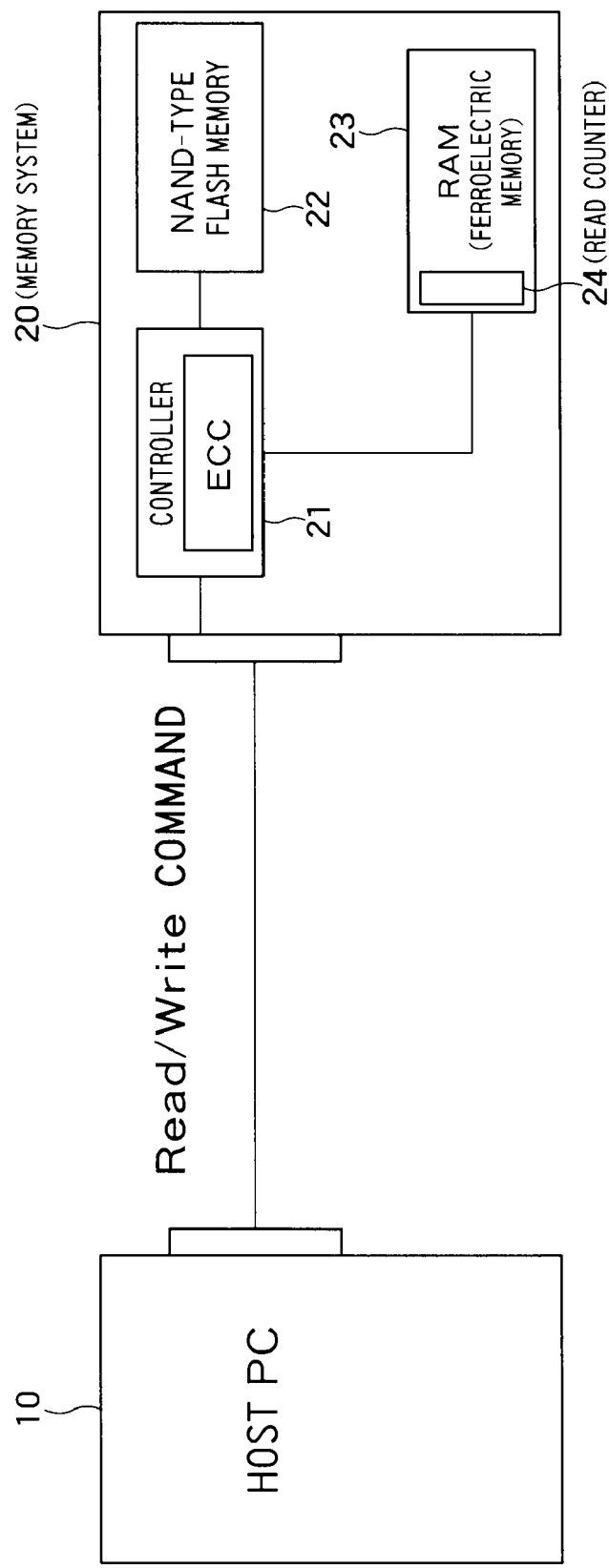
FIG. 1 is a block diagram showing a configuration of a memory system 20 according to a first embodiment of the present invention.

FIG. 1 is a block diagram showing a configuration of a memory system 20 according to a first embodiment of the present invention. The memory system 20 is communicably connected to a host PC 10. In response to a read command or a write command from the host PC 10, the memory system 20 performs a data read operation or a data write operation according to the command.

The memory system 20 includes a controller 21 serving as a control unit, a NAND flash memory (hereinafter, "NAND memory) 22 serving as a first memory device, and a ferroelectric memory (hereinafter, "RAM") 23 serving as a second memory device.

The NAND memory 22 is, for example, an EEPROM type nonvolatile memory and used as a main storage memory. The NAND memory 22 is configured to include blocks each including a plurality of pages, and each page includes a plurality of bits stored in a plurality of memory cells (i.e., includes a plurality of memory cells). A data write operation or a data read operation is normally performed on one page. A data erase or rewrite operation is normally performed on one block serving as a memory group. Due to this, addresses are allocated to the pages and the blocks, respectively. In the first embodiment, a unit of data write, a unit of data rewrite or a unit of data erase is not limited to one page or one block but may be another memory group. The memory group is defined as a unit of the memory including a plurality of memory cells.

The RAM 23 serves as a cache memory that temporarily stores therein data stored in the NAND memory 22 if the data is to be refreshed or that temporarily stores therein data read from or written to the NAND memory 22 if the data is read from or written to the NAND memory 22. The controller 21 controls the NAND memory 22 and the RAM 23. The controller 21 includes an ECC circuit which is used to perform an arithmetic operation such as calculation of the number of error bits (hereinafter, "error bit count") (the number of error cells (hereinafter, "error cell count")) having been subjected to an error correction.

The NAND memory 22 is excellent as its high integration. The RAM 23 can perform a data read or write operation at high speed. The RAM 23 includes a read counter 24. The read counter 24 stores therein the number of data reads (hereinafter "data read count") for every block.

Figure 2:
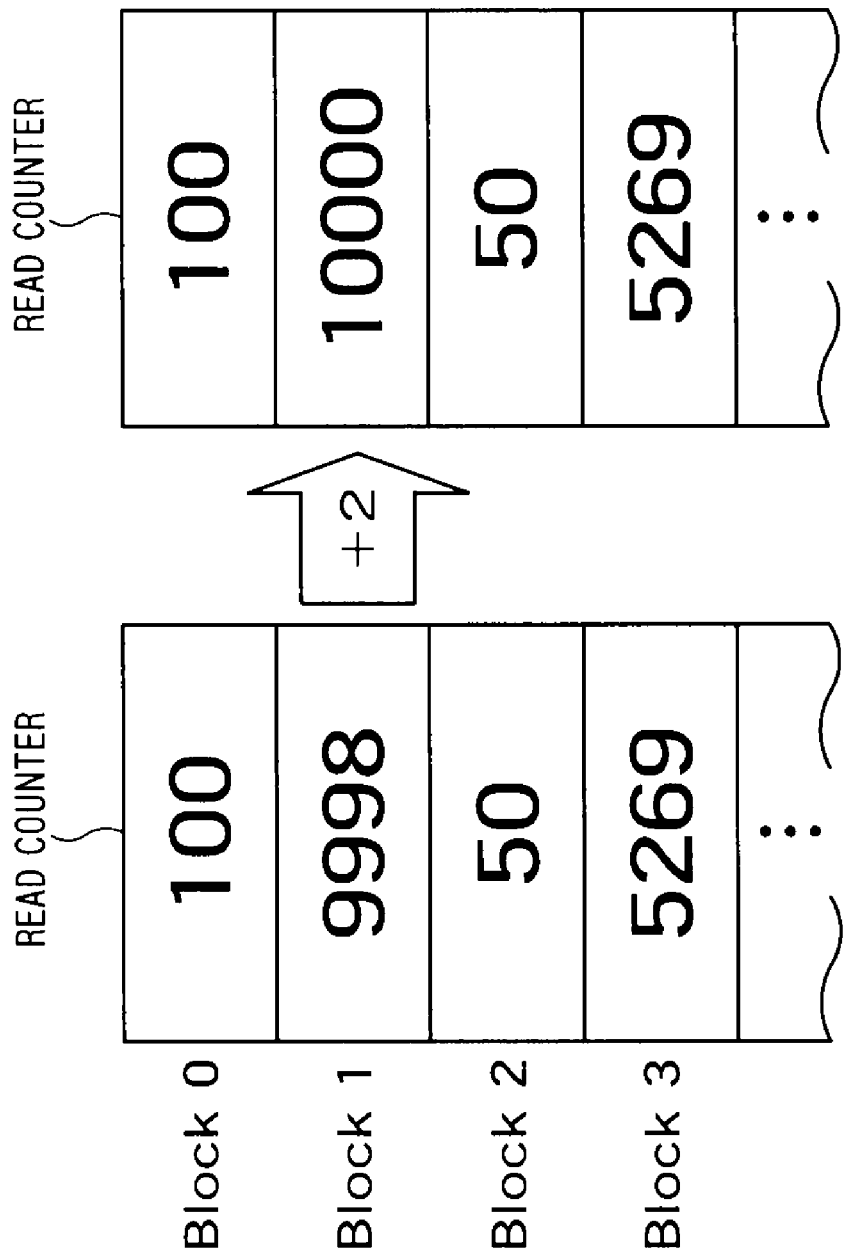
FIG. 2 is a conceptual diagram showing a configuration of the read counter 24.

FIG. 2 is a conceptual diagram showing a configuration of the read counter 24. The read counter 24 stores therein the total of pages on which the data read operation is performed for every block. For example, if two pages in block 1 are read, then '2' is added to a read count for the block 1, and a resultant value is stored in the read counter 24 as the read count for the block 1. The read counter 24 is included in the nonvolatile RAM 23, so that loss of information on read counts does not occur even during momentarily blackout.

Figure 3:
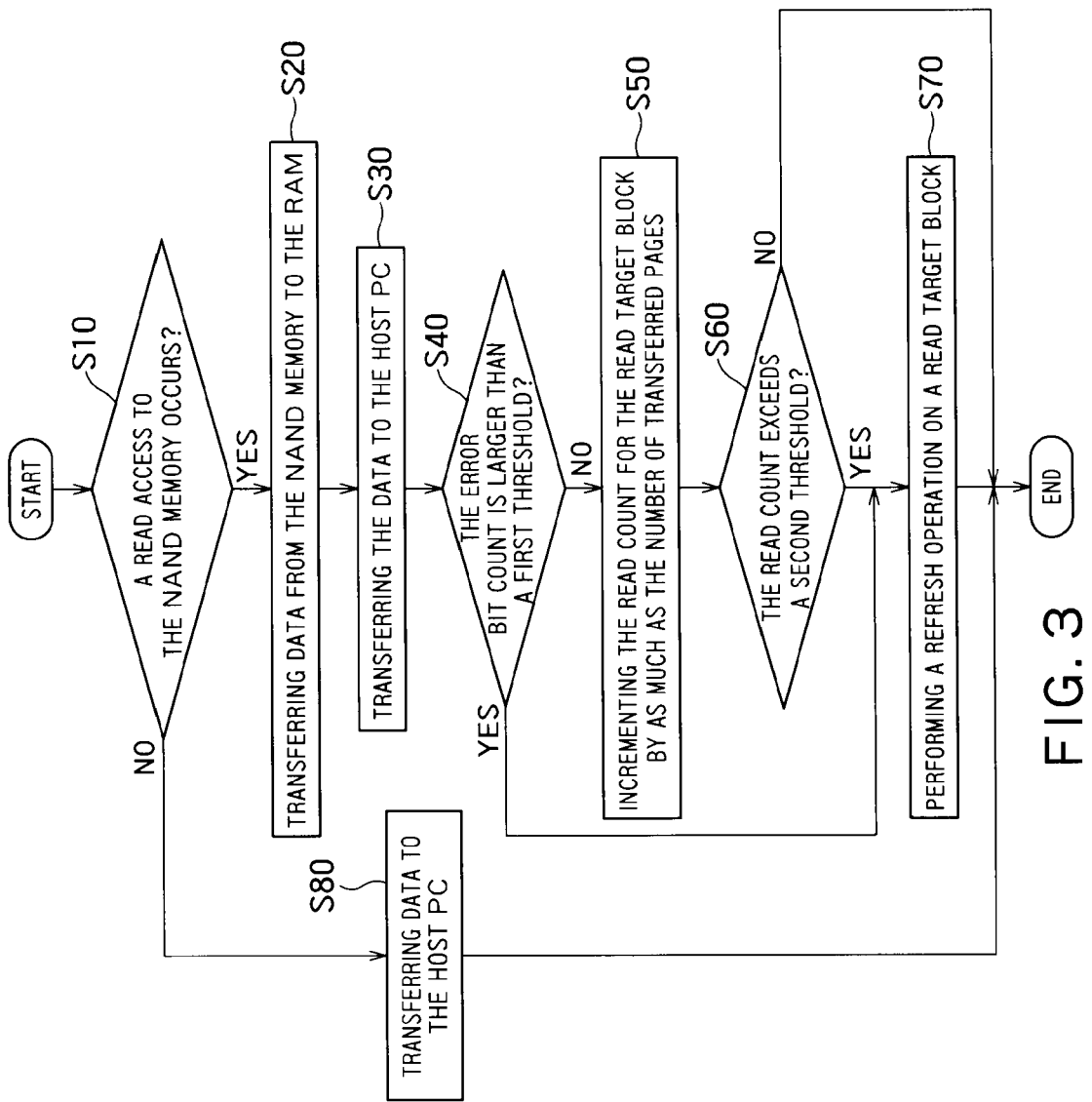
FIG. 3 is a flowchart showing an operation performed by the memory system 20 according to the first embodiment.

FIG. 3 is a flowchart showing an operation performed by the memory system 20 according to the first embodiment. First, the memory system 20 receives a read or write command from the host PC 10. The controller 21 determines whether a read access to the NAND memory 22 occurs based on a transfer start address, a transfer capacity and the like (S10). Namely, the controller 21 determines whether a read operation for reading data from the NAND memory 22 is to be executed.

If data is to be read from the NAND memory (S10; YES), the controller 21 transfers data from the NAND memory 22 to the RAM 23 (S20). The data read operation is performed on every page. The controller 21 transfers the data to the host PC 10 (S30). If the data is to be transferred to the RAM 23, the ECC circuit calculates an error bit count of the read data (S40). If the error bit count is larger than a first threshold (S40; YES), the controller 21 performs a refresh operation on a read target block (S70). This is because much bit data out of the read data can be determined to be destroyed by the influence of retention failure or read disturbance if the error bit count is higher than the first threshold. During the refresh operation, error bit-corrected data is rewritten to the NAND memory 22.

The first threshold is decided based on a maximum error bit count of bits correctable by the ECC circuit. For example, the first threshold can be set to 80% of the maximum error bit count per page. In this case, the refresh operation is performed if an actual error bit count per page exceeds 80% of the maximum error bit count. The first threshold can be stored in a register (not shown) included in the ECC circuit. If the refresh operation is finished, the read count stored in the read counter 24 for the read target block is reset to zero.

If the error bit count is equal to or lower than the first threshold (S40; NO), the controller 21 increments the read count stored in the read counter 24 for the read target block data by as much as the number of transferred pages (S50). For example, if the controller 21 transfers data corresponding to two pages from the block 1 of the NAND memory 22 during the data read operation, the controller 21 increments the read count stored in the read counter 24 for the block 1 by 2.

Next, the controller 21 determines whether the read count stored in the read counter 24 for the read target block exceeds a second threshold (S60). If the read count stored in the read counter 24 for the read target block exceeds the second threshold (S60; YES), the controller 21 performs a refresh operation on the read target block (S70). If the read count for the read target block is equal to or lower than the second threshold (S60; NO), the controller 21 finishes the data read operation. The refresh operation at the step S70 is performed to prevent the read disturbance. It is, therefore, preferable that the second threshold is set to be equal to or lower than a read count by which the read disturbance will occur. For example, the second threshold can be set to 80% of the read count by which the read disturbance will occur. The read count by which the read disturbance occurs is a statistically predictable numeric value from manufacturing conditions and the like.

If data is not to be read from the NAND memory (S10; NO), the controller 21 transfers data to the host PC 10 (S80) and finishes the data read operation.

Figure 4:
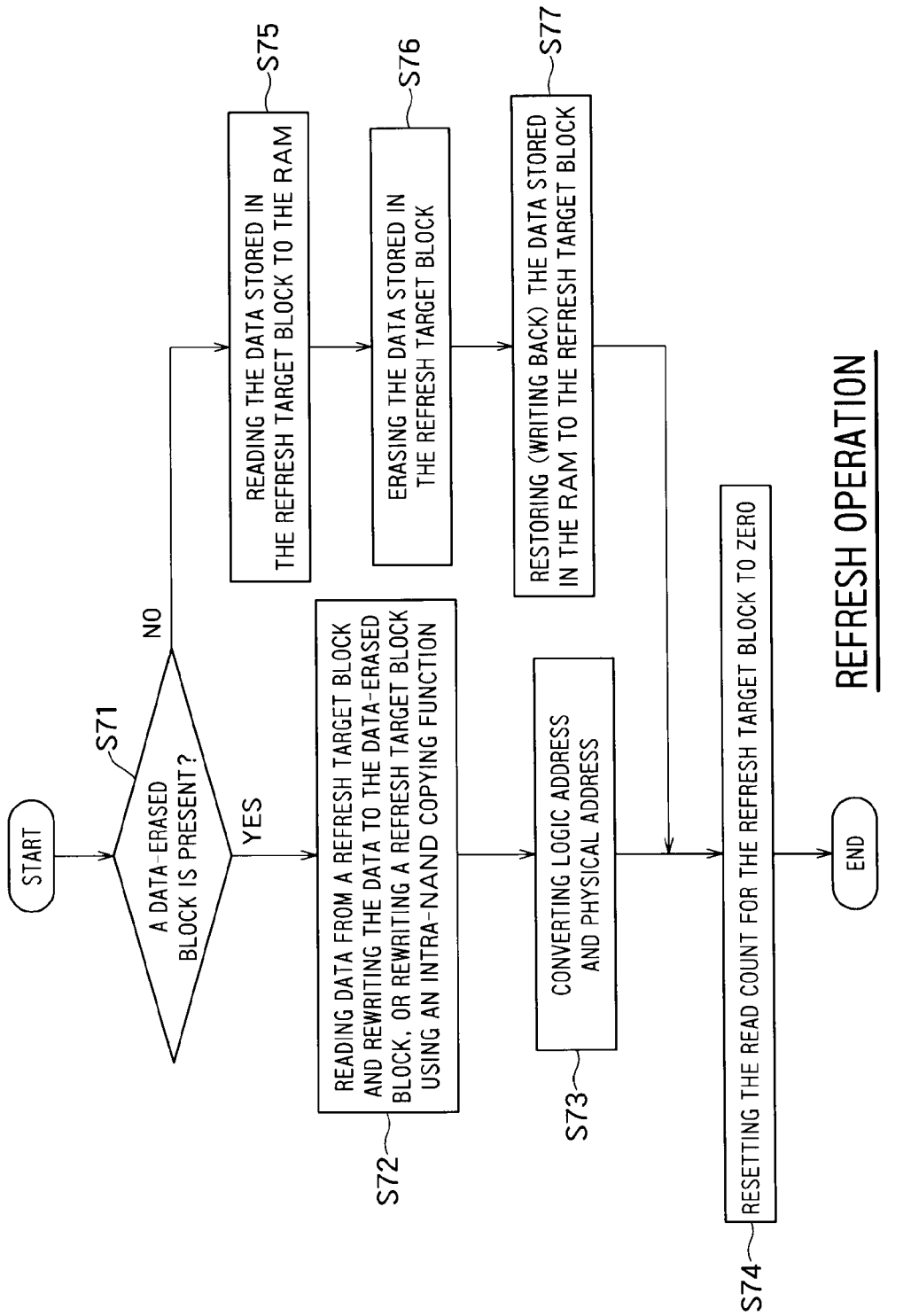
FIG. 4 is a flowchart showing the refresh operation.

FIG. 4 is a flowchart showing the refresh operation. If a data-erased block is present (S71; YES), wear leveling is performed (S72, S73). More specifically, the controller 21 reads all data from a refresh target block, and writes the data to the data-erased block (S72). It is assumed here that the block 2 is a data-erased block and that the block 1 is a refresh target block. In this case, the controller 21 reads the data from the block 1, stores the read data in the RAM 23 once, and writes this data to the block 2. The data stored in the block 1 is erased. The controller 21 thereby transfers the data to the block 2 that is not used (having a low use frequency). As a result, retention failure can be prevented. If the NAND memory 22 includes an intra-NAND copying function, the controller 21 can copy data stored in the refresh target block to the data-erased block using the intra-NAND copying function without using the RAM 23.

After transferring the data, the controller 21 performs logic address and physical address conversion (S73). For example, if data stored in the block 1 is transferred to the block 2, a logic address of the block 1 is exchanged for a logic address of the block 2. By doing so, a logic address corresponding to the data transferred to the block 2 is allocated to the block 2. Thereafter, the controller 21 resets the read count stored in the read counter 24 for the refresh target block to zero (S74).

If data is stored in all the blocks of the NAND memory 22 and no data-erased block is present (S71; NO), then the controller 21 reads all the data stored in the refresh target block, stores the read data in the RAM (S75), erases the data stored in the refresh target block (S76), and restores (writes back) the data stored in the RAM 23 to the refresh target block (S77). After the refresh operation, the controller 21 resets the read count stored in the read counter 24 for the refresh target block to zero (S74).

According to the first embodiment, if the error bit count exceeds the first threshold or if the data read count exceeds the second threshold, the refresh operation is performed on the read target block. This can prevent the read disturbance without relying only on the ECC. Further, in the first embodiment, the refresh operation is performed according to the error bit count counted by the ECC. It is, therefore, possible to not only prevent the read disturbance but also correct data retention error.

Generally, in the refresh operation, all the data stored in the refresh target block of the NAND memory 22 is read from the refresh target block and stored in the RAM 23 once and restored (written back) to the refresh target block. However, if written data (updated data) is present in the RAM 23, there is no need to read update target pages belonging to the refresh target block. In this case, therefore, pages other than the update target pages in the refresh target block are read and stored in the RAM 23, and the read pages as well as the update target pages can be read from the RAM 23 and written to the refresh target block.

Second Embodiment

Figure 5:
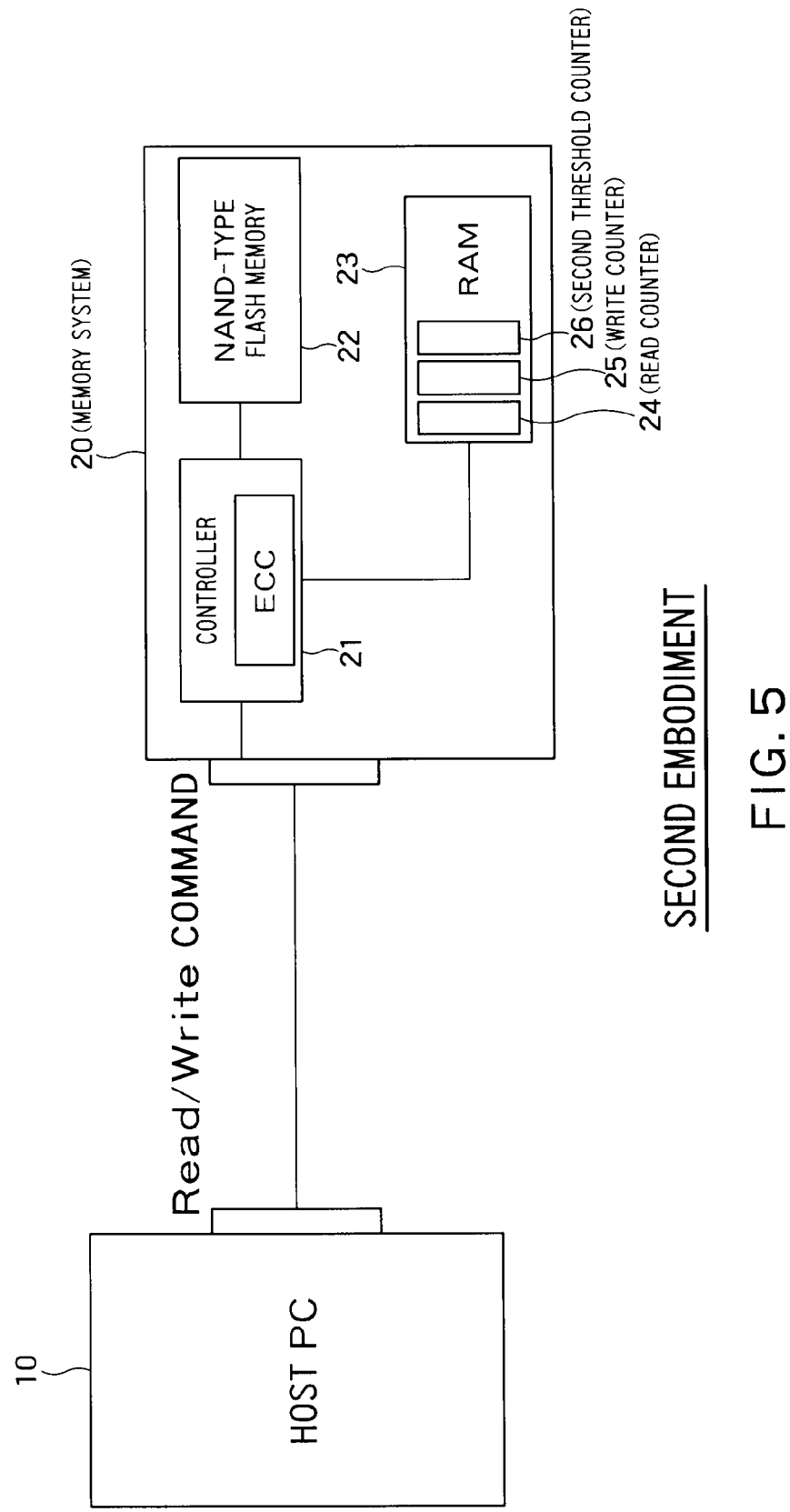
FIG. 5 is a block diagram showing a configuration of a memory system 20 according to a second embodiment of the present invention.

FIG. 5 is a block diagram showing a configuration of a memory system 20 according to a second embodiment of the present invention. The second embodiment differs from the first embodiment in that the RAM 23 includes a write counter 25 and a second threshold register 26. Other configurations according to the second embodiment can be the same as those according to the first embodiment.

Figure 6:
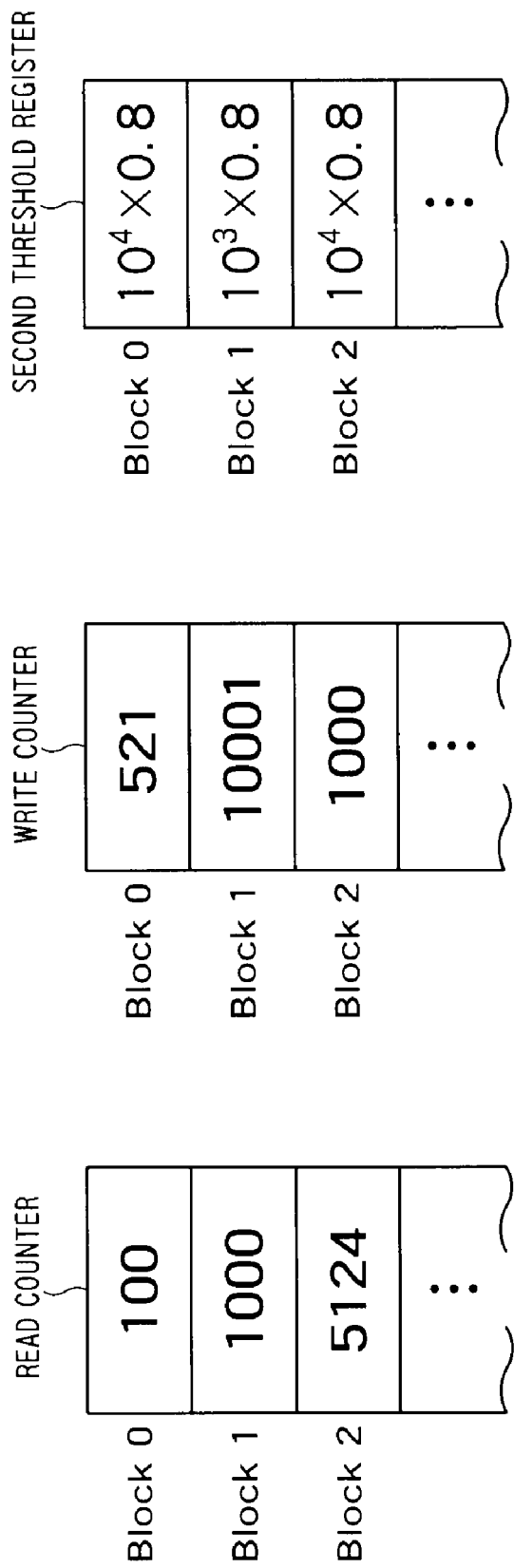
FIG. 6 is a conceptual diagram showing configurations of the read counter 24, the write counter 25, and the second threshold register 26.

FIG. 6 is a conceptual diagram showing configurations of the read counter 24, the write counter 25, and the second threshold register 26. The write counter 25 stores therein the number of erases (the number of writes) for a write target block for every block. Namely, since data is erased from a certain block before data is written to the certain block in the NAND flash memory 22, the write counter 25 calculates an erase count (a write count) for this certain block. The write counter 25 is included in the nonvolatile RAM 23, so that loss of information on the erase counts (the write counts) does not occur even during momentarily blackout.

The second threshold register 26 stores therein the second threshold for every block. This is because the second threshold often differs according to the write count for each block. Loss of information on the second thresholds does not occur even during momentarily blackout.

Figure 7:
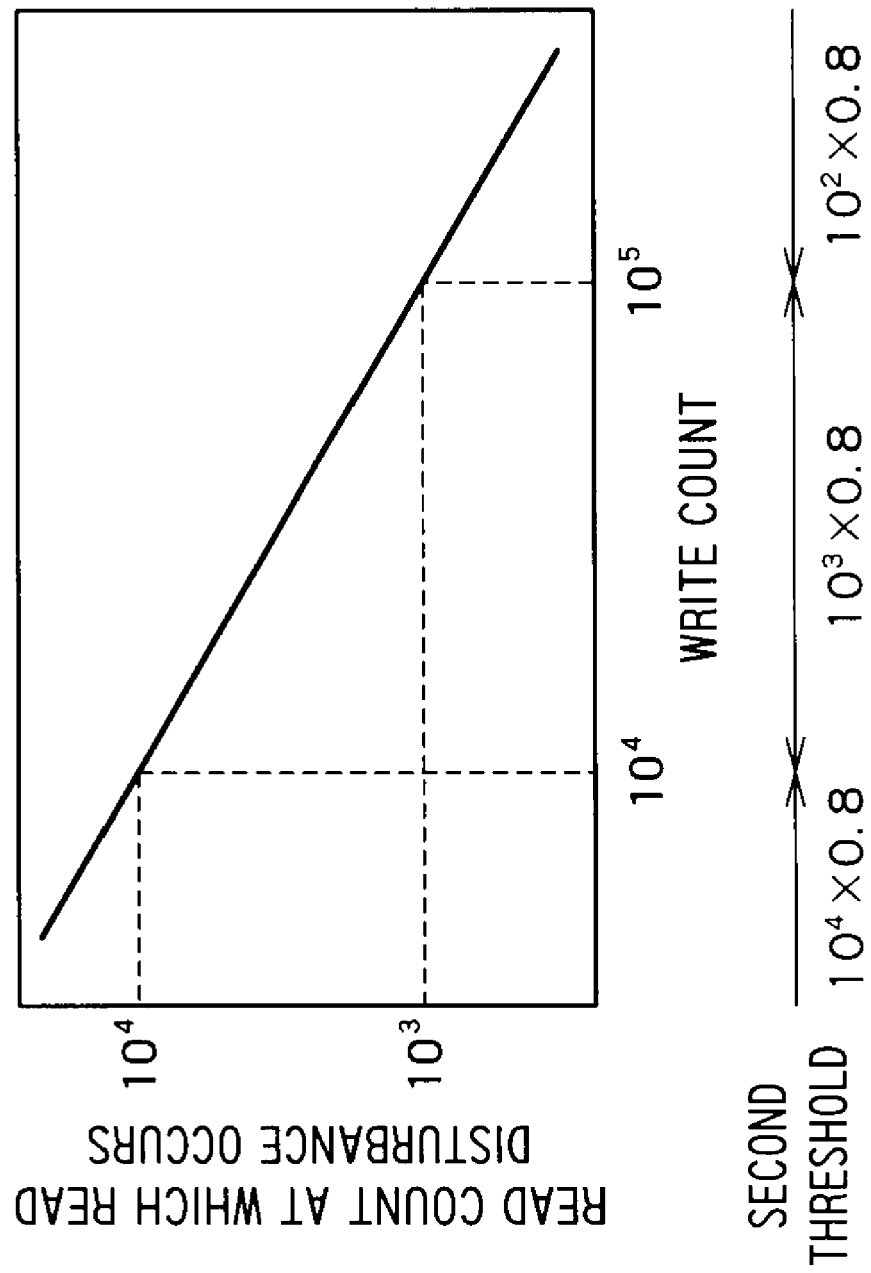
FIG. 7 is a graph showing a relationship between the read count and the write count.

The erase counts or the write counts stored in the write counter 25 is used to change the second threshold according to the data write count. As shown in FIG. 7, the read count by which the read disturbance occurs generally falls according to a rise in the write count. This is because the gate dielectric film of each memory cell physically deteriorates and the read disturbance tends to occur if the write count rises. Therefore, in the second embodiment, the second threshold is set lower if the write count is higher.

For example, as shown in FIG. 7, if the write count is equal to or lower than $10^4$, the second threshold is set to 80% of a minimum read count of $10^4$ by which the read disturbance occurs in the range in which the write count is equal to or lower than $10^4$. If the write count is from $10^4$ to $10^5$, the second threshold is set to 80% of the minimum read count of $10^3$ by which the read disturbance occurs in the range in which the write count is from $10^4$ to $10^5$. If the write count is equal to or higher than $10^5$, the second threshold is set to 80% of the minimum read count of $10^2$. Correspondences between the data write counts and the second thresholds can be stored together with the second thresholds for the blocks in the RAM 23, respectively.

An operation performed by the memory system 20 according to the second embodiment is similar to that according to the first embodiment in that a refresh operation is performed based on the error bit count detected by the ECC circuit and the read count. Therefore, the operation shown in FIGS. 3 and 4 can be applied to that according to the second embodiment. However, differently from the first embodiment, the second threshold is changed according to the write count and is, therefore, a variable. As can be seen, by changing the second threshold according to the write count, refresh operation frequency can be changed in view of the deterioration in the gate dielectric film of each memory cell.

For example, as shown in FIG. 6, with respect to read counts for blocks 0 to 2, respectively, the read count for the block 2 (5124) is higher than that for the block 1 (1000). However, with respect to write counts for the blocks 0 to 2, respectively, the write count for the block 1 (10001) is higher than that for the block 2 (1000). Due to this, the second threshold for the block 1 is $10^3 \times 0.8$ and that for the block 2 is $10^4 \times 0.8$. Accordingly, if data is read from the block 1, the block 1 becomes a refresh target block. However, if data is read from the block 2, the block 2 does not become a refresh target block.

In the second embodiment, the second threshold is changed step by step according to the write count. Alternatively a frequency of changing the second threshold can be set higher than that shown in FIG. 7. Alternatively, the second threshold can be changed whenever the write count is updated.

According to the second embodiment, by changing the second threshold according to the write count, the second threshold can be changed depending on occurrence degree of the read disturbance. Further, the second embodiment can exhibit the same advantages as those of the first embodiment.

Third Embodiment

Figure 8:
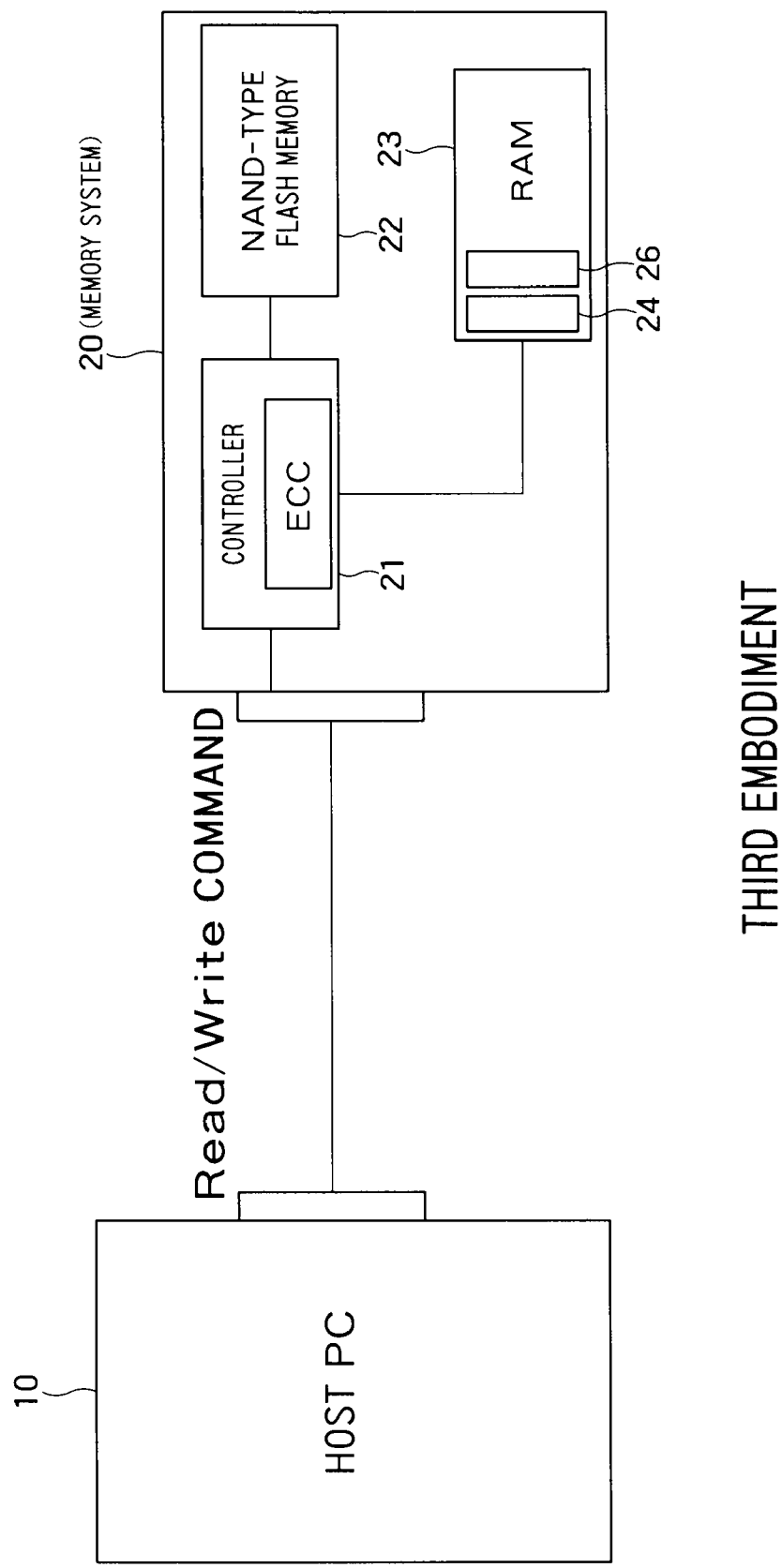
FIG. 8 is a block diagram showing a configuration of a memory system 20 according to a third embodiment of the present invention.
Figure 9:
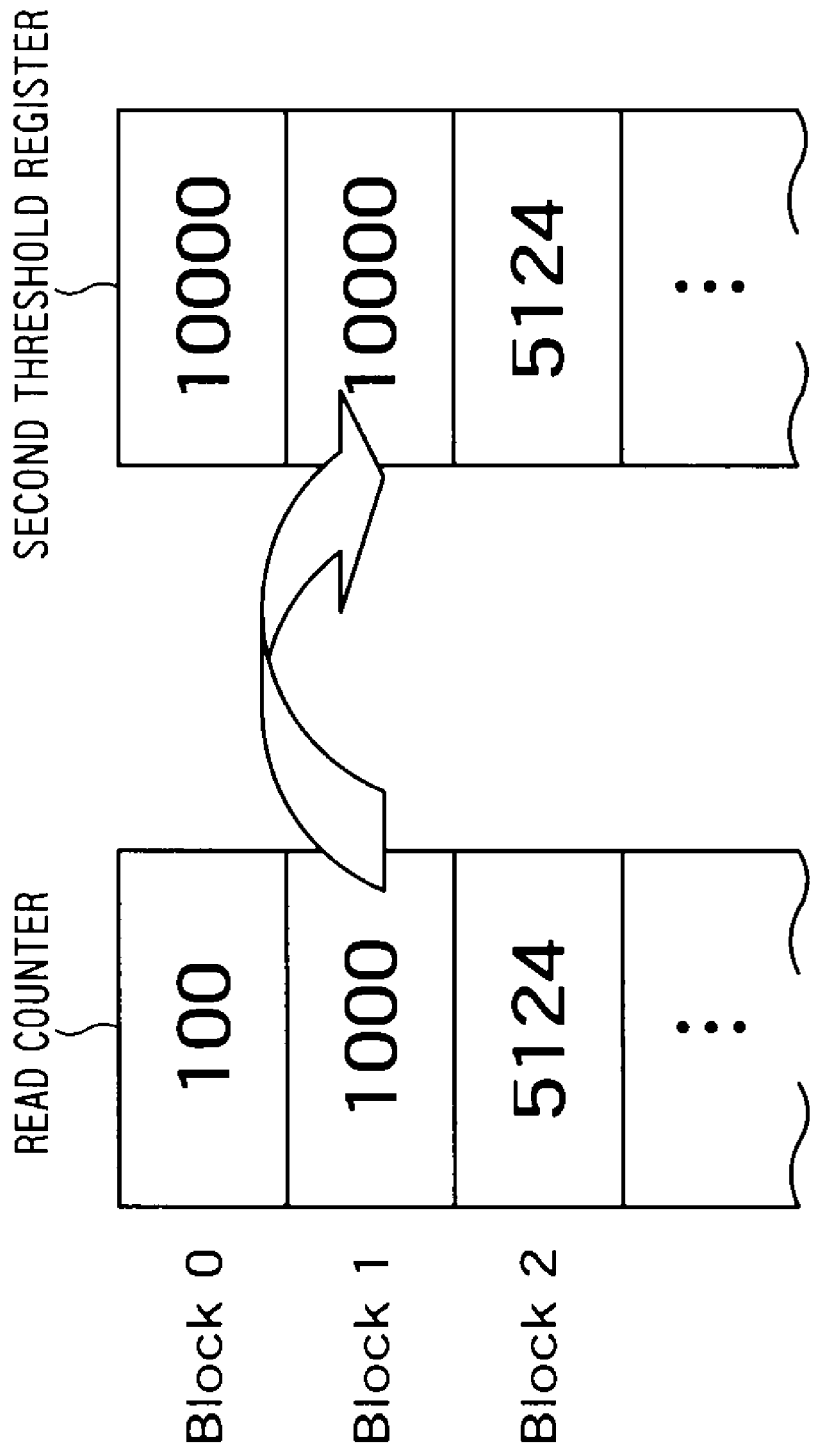
FIG. 9 is a conceptual view showing a read counter 24 and a second threshold register 26.
Figure 10:
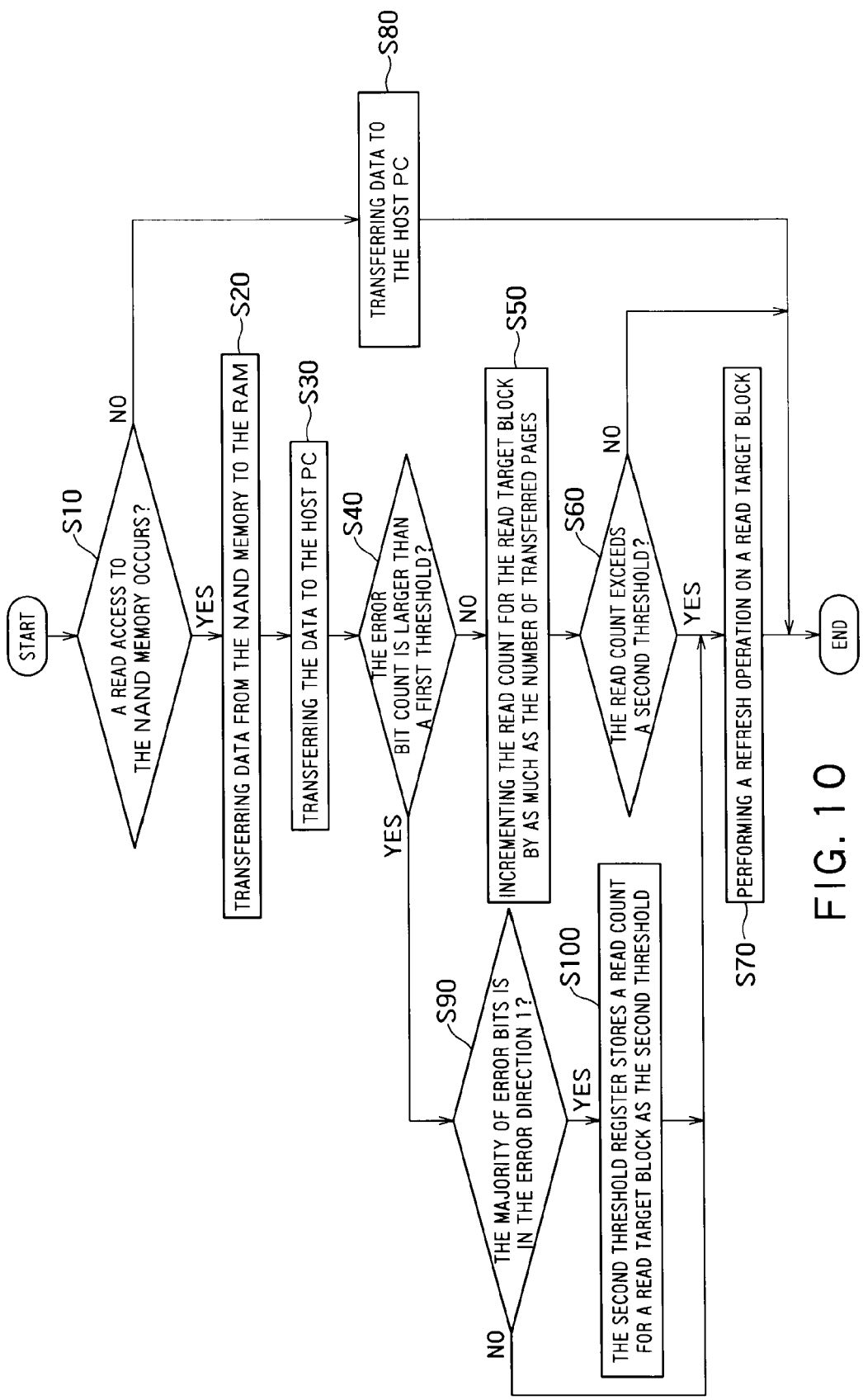
FIG. 10 is a flowchart showing an operation performed by the memory system 20.

FIG. 8 is a block diagram showing a configuration of a memory system 20 according to a third embodiment of the present invention. FIG. 9 is a conceptual view showing a read counter 24 and a second threshold register 26. FIG. 10 is a flowchart showing an operation performed by the memory system 20. In the third embodiment, the second threshold is changed according to an error bit count detected by an ECC circuit and a data error direction. The third embodiment, therefore, differs from the second embodiment by including the second threshold register 26. Other configurations according to the third embodiment can be the same as those according to the first embodiment.

The data error direction indicates either an instance (an error direction 1) where a logic value changes from 0 to 1 or an instance (an error direction 2) where a logic value changes from 1 to 0. It is defined, for example, that a state where many electrons are accumulated in a floating gate of a memory cell is "1" and that a state where electrons are not accumulated in the floating gate of the memory cell is "0". In this case, it can be determined that the error direction 1 is resultant from read disturbance and that the error direction 2 is resultant from retention failure. This follows that if more error bits are in the error direction 1, the influence of the read disturbance is greater, and that if more error bits are in the error direction 2, the influence of the retention failure is greater.

In the third embodiment, as shown in FIG. 10, if the error bit count exceeds the first threshold and the majority of error bits is in the error direction 1 (S90), the second threshold register 26 stores a read count for a read target block as the second threshold for the read target block (S100). Since steps S10 to S80 shown in FIG. 8 are the same as those in the first embodiment, descriptions thereof will be omitted.

It is assumed here that data in the block 1 is read. If the error bit count of the read data exceeds the first threshold, the controller 21 further determines the error direction of the data. The error direction can be determined from logic values of error bits. At this time, if the majority of (e.g., 80% of) the error bits is in the error direction 1, the second threshold (10000) for the block 1 is set to the read count (1000) therefore. Namely, the second threshold for the block 1 is changed from 10000 to 1000. Thereafter, since the second threshold for the block 1 is 1000, a refresh operation is performed on the block 1 if the read count exceeds 1000.

In this way, if the main cause of data destruction is the read disturbance, the read count during the data read operation is set as the second threshold. By so setting, even if the second threshold is excessively higher than the read count by which the read disturbance actually occurs by the deterioration in the gate dielectric film of each memory cell, the second threshold can be appropriately changed.

Modification of the Third Embodiment

Figure 11:
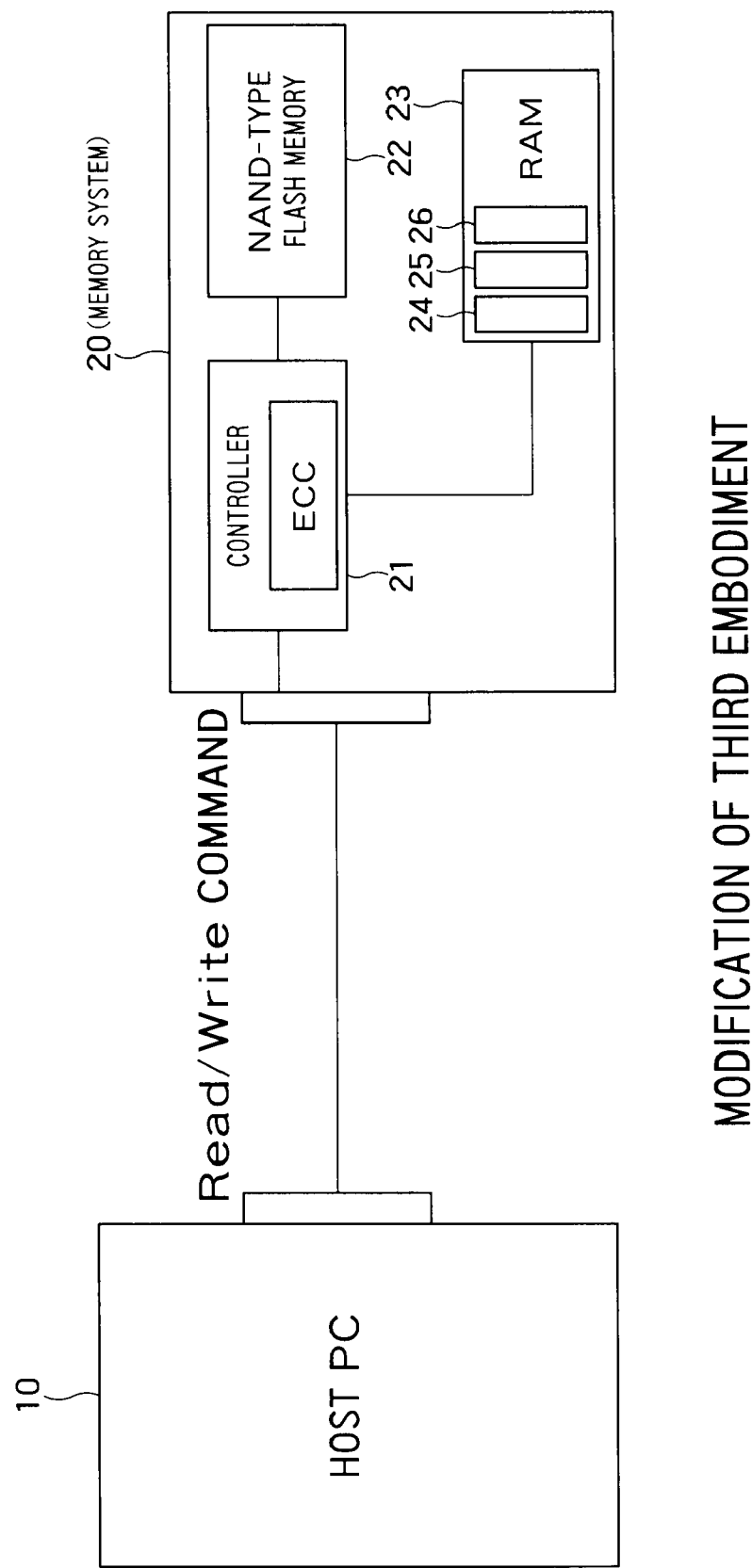
FIG. 11 and FIG. 12 are configuration diagrams of a memory system according to a modification of the third embodiment of the present invention.
Figure 12:
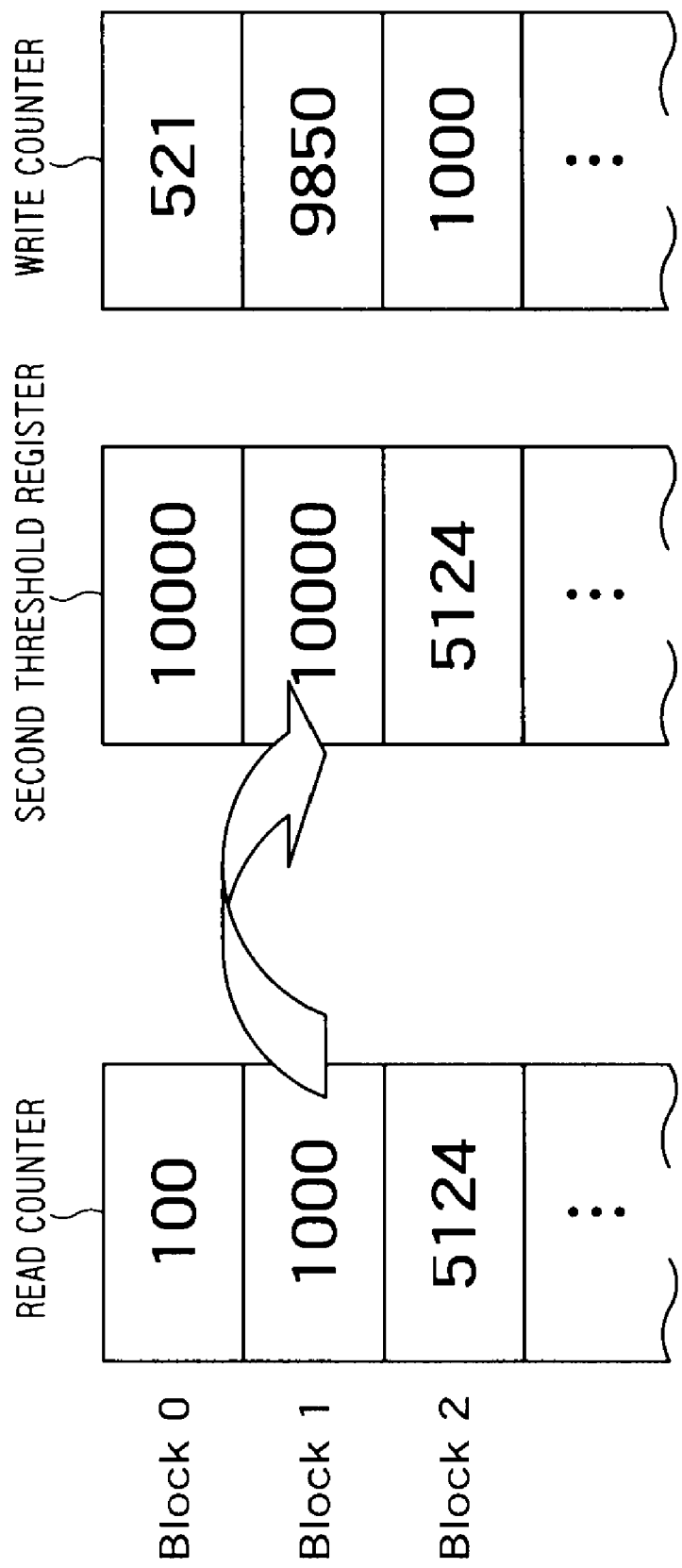

FIG. 11 is a block diagram a configuration of a memory system 20 according to a modification of the third embodiment of the present invention, and FIG. 12 is a conceptual view showing a read counter 24, a second threshold register 26, and a write counter 25. The modification of the third embodiment is an embodiment in which the write counter 25 is added to the memory system 20 according to the third embodiment. The write counter 25 can be configured similarly to that according to the second embodiment. In the modification of the third embodiment, the controller 21 compares a second threshold according to a write count with that according to an error bit count and an error direction, and selects the lower as the second threshold. The second threshold according to the write count is used to prevent retention failure. The second threshold according to the error bit count and the error direction is used to prevent read disturbance. The modification of the third embodiment can, therefore, deal with both the retention failure and the read disturbance.

Fourth Embodiment

Figure 13:
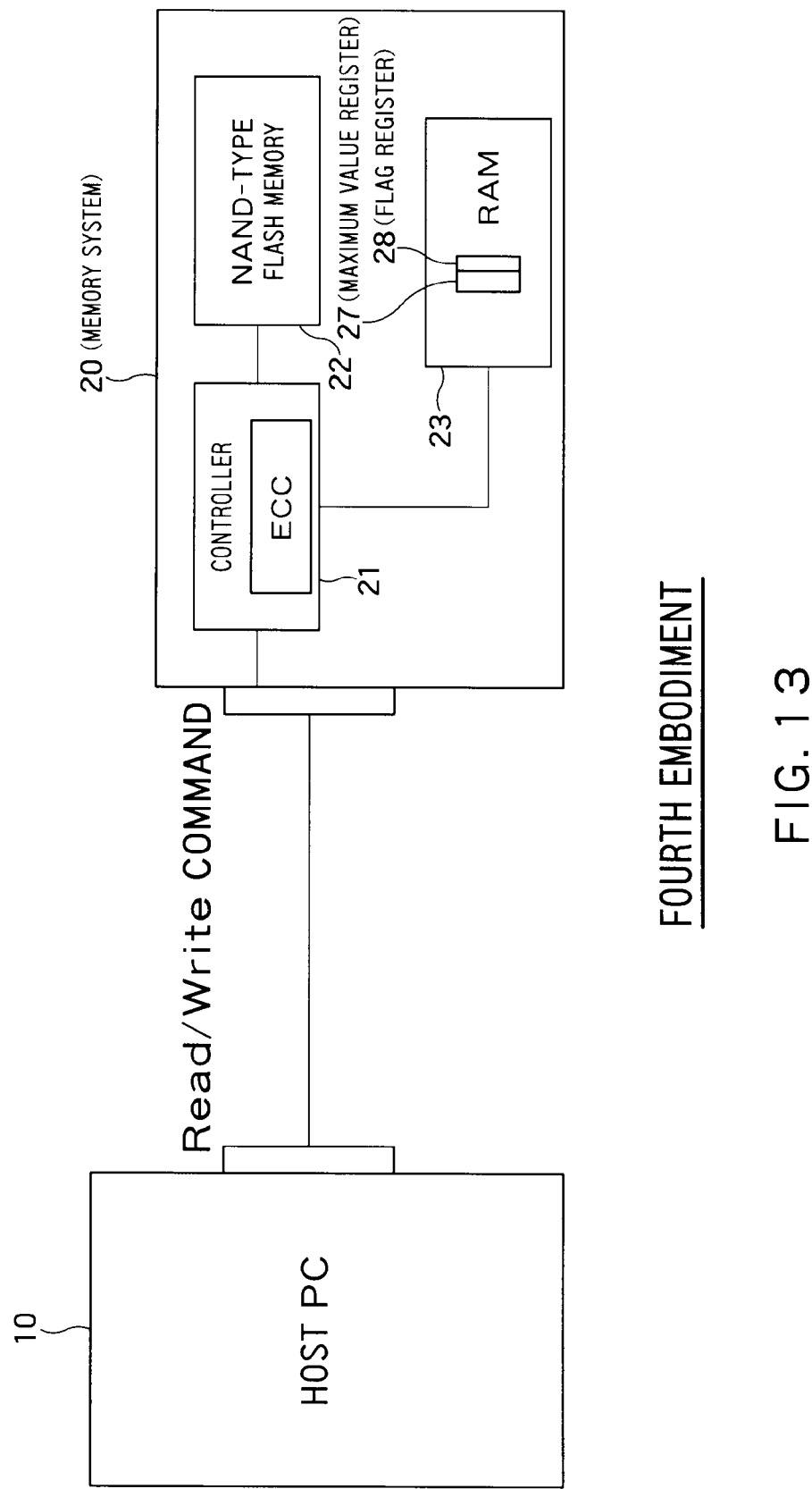
FIG. 13 is a block diagram showing a configuration of a memory system 20 according to a fourth embodiment of the present invention.

FIG. 13 is a block diagram showing a configuration of a memory system 20 according to a fourth embodiment of the present invention. FIG. 14 is a conceptual diagram showing a maximum value register 27 and a flag register 28. The fourth embodiment differs from the first embodiment by including the maximum value register 27 and the flag register 28. Other configurations according to the fourth embodiment can be the same as those according to the first embodiment.

The maximum value register 27 holds a maximum error bit count among error bit counts detected by the ECC circuit during a period between a certain refresh operation and a next refresh operation. This maximum error bit count is a maximum error bit count for every read target unit. For example, if the read target unit is a page, a bit count for a page is equal to a maximum value of maximum error bit counts. Needless to say, a minimum value of the maximum error bit counts is zero. For example, in FIG. 14, during the period from a certain refresh operation to a next refresh operation, the maximum error bit count for block 0 is 5 and that for block 1 is 30.

The flag register 28 includes data of one bit for every block. Namely, the flag register 28 stores therein bit data corresponding to the number of blocks. A flag indicates a first read operation since restart of supply of power if the supply of power restarts after the supply of power to the memory system 20 stops. For example, a block with flag 0 is a block in which a data read operation is not performed after the memory system 20 is turned on. A block with flag 1 is a block in which at least one data read operation is performed after the memory system 20 is turned on. If the memory system 20 is turned off, the flag register 28 set flags corresponding to all the blocks to zero. It is confirmed by the flag whether a read target block is a block on which the data read operation is performed for the first time since the memory system 20 is turned on.

If an error bit count for a block in the data read operation performed for the first time since the supply of power to the memory system 20 restarts is higher than the maximum error bit count before restart of the supply of power, the controller 21 performs a refresh operation on the block. If a retention failure occurs while the memory system 20 is turned off, the error bit count after the memory system 20 is turned on is considered to exceed the maximum error bit count before the memory system is turned off. Accordingly, by performing the refresh operation on the block including more error bits caused by the retention failure, the error bits are corrected.

It is assumed here that data is read from the block 1. Since the flag corresponding to the block 1 is flag 0, this indicates that the block 1 becomes a read target block for the first time since the memory system 20 is turned on. If the error bit count for read target pages is 50, the error bit count in the first data read operation is higher than the maximum bit count 30 before the memory system 20 is turned off. Namely, the block 1 includes many bits to which the retention failure occurs while the memory system 20 is turned off. In this case, therefore, the controller 21 performs the refresh operation on the block 1. By doing so, the memory system 20 according to the fourth embodiment can correct the error bits resultant from the retention failure.

Modification of the Fourth Embodiment

Figure 15:
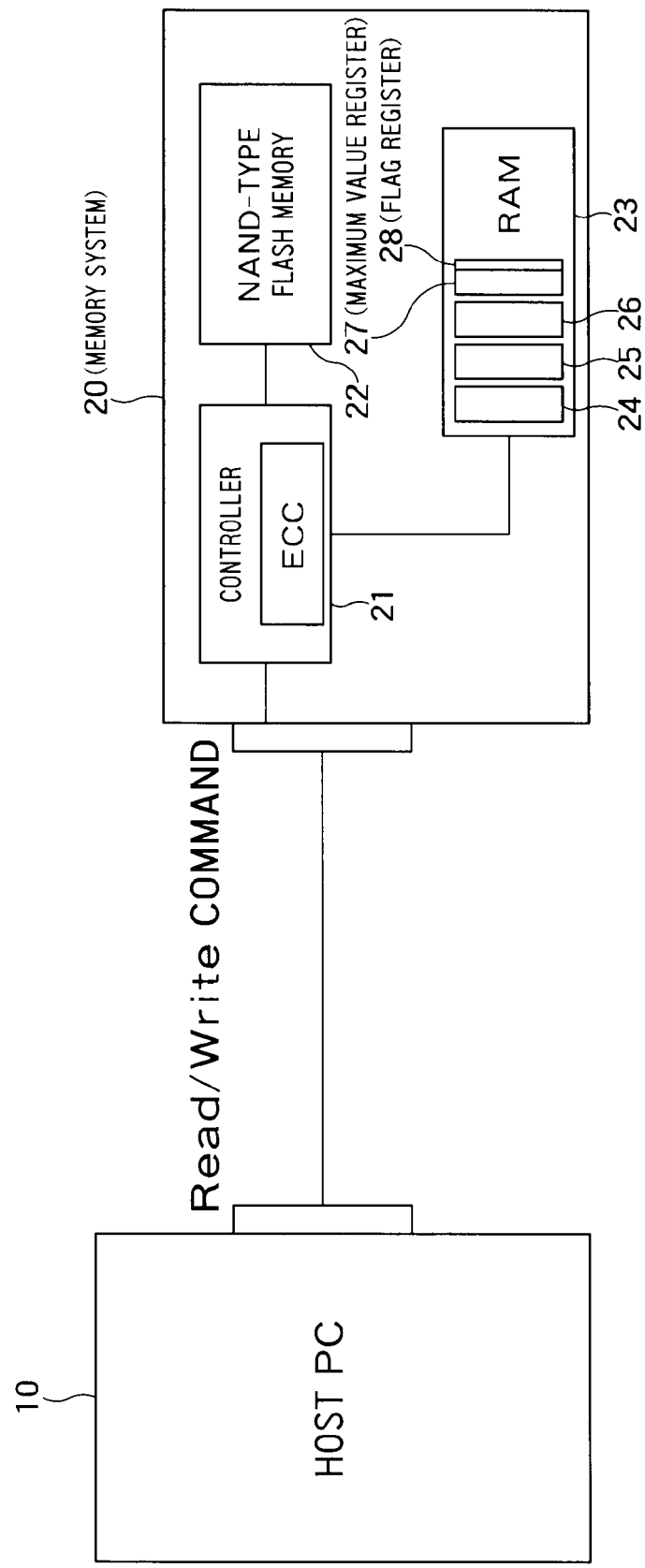
FIG. 15 is a block diagram showing a configuration of a memory system 20 according to a modification of the fourth embodiment of the present invention.

FIG. 15 is a block diagram showing a configuration of a memory system 20 according to a modification of the fourth embodiment of the present invention. The memory system 20 according to the medication of the fourth embodiment further includes a read counter 24, a write counter 25, and a second threshold register 26. Namely, the modification of the fourth embodiment is a combination of the second embodiment with the fourth embodiment. The maximum value register 27 and the flag register 28 can operate independently of the read counter 24, the write counter 25, and the second threshold register 26. It is thereby possible to prevent read disturbance according to the write count and the read count and to correct error bits resultant from the retention failure.

Needless to say, the fourth embodiment can be combined with the first or third embodiment.

In the first to fourth embodiments, the RAM 23 is a nonvolatile memory and can be, for example, an MRAM (Magnetic RAM), a PRAM (Phase Change RAM) or a RRAM (Resistive RAM).

The read counter 24, the write counter 25, the second threshold register 26, the maximum value register 27, and/or the flag register 28 can be incorporated into the RAM 23 as a part of the RAM 23 as described in the first to fourth embodiments. Alternatively, the read counter 24, the write counter 25, the second threshold register 26, the maximum value register 27, and/or the flag register 28 can be provided separately from the RAM 23 or incorporated in the host PC 10.

In the first to fourth embodiments, the ECC circuit is incorporated in the controller 21. Alternatively, the ECC circuit can be provided separately from the controller 21.

The invention claimed is:

1. A semiconductor memory device comprising:
   first memory region including a plurality of memory groups including a plurality of memory cells, addresses being respectively allocated for the memory groups, the memory groups respectively being units of data erase operations;
   a second memory region configured to temporarily store data read from the first memory region or to temporarily store data to be written to the first memory region;
   a read counter configured to store a data read count for each memory group;
   an error-correcting circuit configured to calculate an error bit count of the read data; and
   a controller configured to:
   if the error bit count of the read data exceeds a first threshold which is determined based on a maximum error bit count of bits correctable by the error-correcting circuit, perform a refresh operation, in which the read data stored in one of the memory groups is temporarily stored in the second memory region and is written back to the same memory group, wherein the data written back is error bit-corrected data; and
   if the error bit count of the read data does not exceed a first threshold and the read count stored in the read counter exceeds a second threshold, perform a refresh operation, in which the read data stored in one of the memory groups is temporarily stored in the second memory region and is written back to the same memory group, wherein the data written back is error bit-corrected data.

2. The semiconductor memory device according to claim 1, wherein a data read operation is performed on one page including a plurality of memory cells, a data erase operation is performed on one block including a plurality of pages, and the read counter stores the data read count for each block.

3. The semiconductor memory device according to claim 2, further comprising a write counter configured to store a data write count for each memory group, wherein
   the control unit changes the second threshold according to the data write count.

4. The semiconductor memory device according to claim 2, wherein when the error bit count exceeds the first threshold and a majority of error bits changes from a first logic value to a second logic value, the second threshold is set as the data read count stored in the read counter.

5. The semiconductor memory device according to claim 1, further comprising a write counter configured to store a data write count for each memory group,
   wherein the control unit changes the second threshold according to the data write count.

6. The semiconductor memory device according to claim 5, wherein when the error bit count exceeds the first threshold and a majority of error bits changes from a first logic value to a second logic value, the second threshold is set as the data read count stored in the read counter.

7. The semiconductor memory device according to claim 1, wherein when the error bit count exceeds the first threshold and a majority of error bits changes from a first logic value to a second logic value, the second threshold is set as the data read count stored in the read counter.

8. The semiconductor memory device according to claim 1, wherein the first memory region and the second memory region include Ferroelectric RAM, MRAM, PRAM or RRAM.

9. The semiconductor memory device according to claim 1, wherein
   the first threshold is lower than the maximum error bit count of bits correctable by the error-correcting circuit,
   the second threshold is set to be equal to or lower than a read count by which read disturbance will occur.

10. A semiconductor memory device comprising
    a first memory region including a plurality of memory groups including a plurality of memory cells, addresses being respectively allocated for the memory groups, the memory groups respectively being units of data erase operations;
    a second memory region configured to temporarily store data read from the first memory region or configured to temporarily store data to be written to the first memory region;
    an error-correcting circuit configured to calculate an error bit count of the read data;
    a controller configured to perform a refresh operation, in which the read data stored in one of the memory groups is temporarily stored in the second memory region and is written back the read data to the same memory group;
    a maximum value register configured to hold a maximum error bit count among error bit counts during a period from a certain refresh operation to a next refresh operation; and
    a flag register configured to store flags for the memory blocks, one of the flags indicating a first read operation to the corresponding memory block after restart of a supply of power to the first memory region, when the supply of the power restarts after stop thereof, wherein
    when the error bit count in the first read operation since the supply of the power to the first memory region restarts is higher than the maximum error bit count before the restart of the supply of the power, the controller executes the refresh operation.

11. The semiconductor memory device according to claim 10, wherein the first memory region and the second memory region include Ferroelectric RAM, MRAM, PRAM or RRAM.

* * * * *